United States Patent [19]
Clarke et al.

[11] Patent Number: 5,017,833
[45] Date of Patent: May 21, 1991

[54] PILOT LIGHT ASSEMBLY

[75] Inventors: Geoffrey Clarke; Geoffrey J. Harris, both of Swindon, United Kingdom

[73] Assignee: Square D Company, Palatine, Ill.

[21] Appl. No.: 435,460

[22] PCT Filed: Apr. 11, 1989

[86] PCT No.: PCT/GB89/00369
§ 371 Date: Dec. 1, 1989
§ 102(e) Date: Dec. 1, 1989

[87] PCT Pub. No.: WO89/09910
PCT Pub. Date: Oct. 19, 1989

[30] Foreign Application Priority Data
Apr. 13, 1988 [GB] United Kingdom ............ 8808704

[51] Int. Cl.$^5$ ............................................. H05B 37/00
[52] U.S. Cl. .............................. 315/51; 315/52; 315/200 R
[58] Field of Search ............... 315/51, 52, 53, 200 R; 362/800

[56] References Cited
U.S. PATENT DOCUMENTS
4,725,759 2/1988 Tachikawa ..................... 315/51

FOREIGN PATENT DOCUMENTS
0026950 4/1981 European Pat. Off. .
0121507 10/1984 European Pat. Off. .
2082748 3/1982 United Kingdom .
2182802 5/1987 United Kingdom .

OTHER PUBLICATIONS
Elektronik, vol. 34, No. 14, Jul. 12, 1985 (Munich, DE), H. Zeltwangen; "SMD-Technik in kleineren und mittleren unternehmen", pp. 43–70.

Primary Examiner—Robert J. Pascal
Attorney, Agent, or Firm—Michael J. Femal

[57] ABSTRACT

The assembly comprises a light-emitting diode (28) and associated circuit components (38, R1-R4) mounted on a printed circuit board (26) all mounted within a housing (10) formed with securement means such as a screw thread (14) for mounting the assembly in a panel (18) with the LED (28) visible from the opposite side of the panel. The circuit components form means for converting a mains voltage at input leads (30) to a low voltage for driving the LED, preferably in the form of an i.c. rectifier bridge (38) and a plurality of volgage-dropping resistors (R1-R4).

14 Claims, 3 Drawing Sheets

PILOT LIGHT ASSEMBLY

BACKGROUND OF THE INVENTION

1. Field of the Invention

This invention relates to a pilot light assembly for indicating the status of an electrical device powered at mains voltage.

2. Description of Prior Art

One application is in an electrical limit switch, where it is ususal to provide a pilot light to indicate the "on" state of the switch. In the past, this has generally been done by means of a neon lamp connected across the appropriate terminals of the switch. The neon lamp is usually secured to a cover member and connected to the switch terminals by flying leads. Assembling such an arrangement can be awkward and we have found that it commonly happens that, after the flying leads have been connected, the cover member (which can be of heavy construction for safety reasons) is dropped by the assembly person. The resulting strain on the leads can cause bad joints or fracture the wire.

SUMMARY OF THE INVENTION

One object of the present invention is to provide a pilot light assembly which can be wired in circuit independently of its being mounted to a cover or other support, and readily secured to or removed from the support after wiring.

Another object of the invention is to provide a pilot light assembly which is entirely solid state, while having dimensions small enough to fit into a restricted space, e.g. the space available in an existing limit switch for a neon indicator.

The invention is defined in the appended claims.

Embodiments of the invention will now be described, by way of example only, with reference to the drawings, in which:

DESCRIPTION OF THE PREFERRED EMBODIMENT

Figure 1:
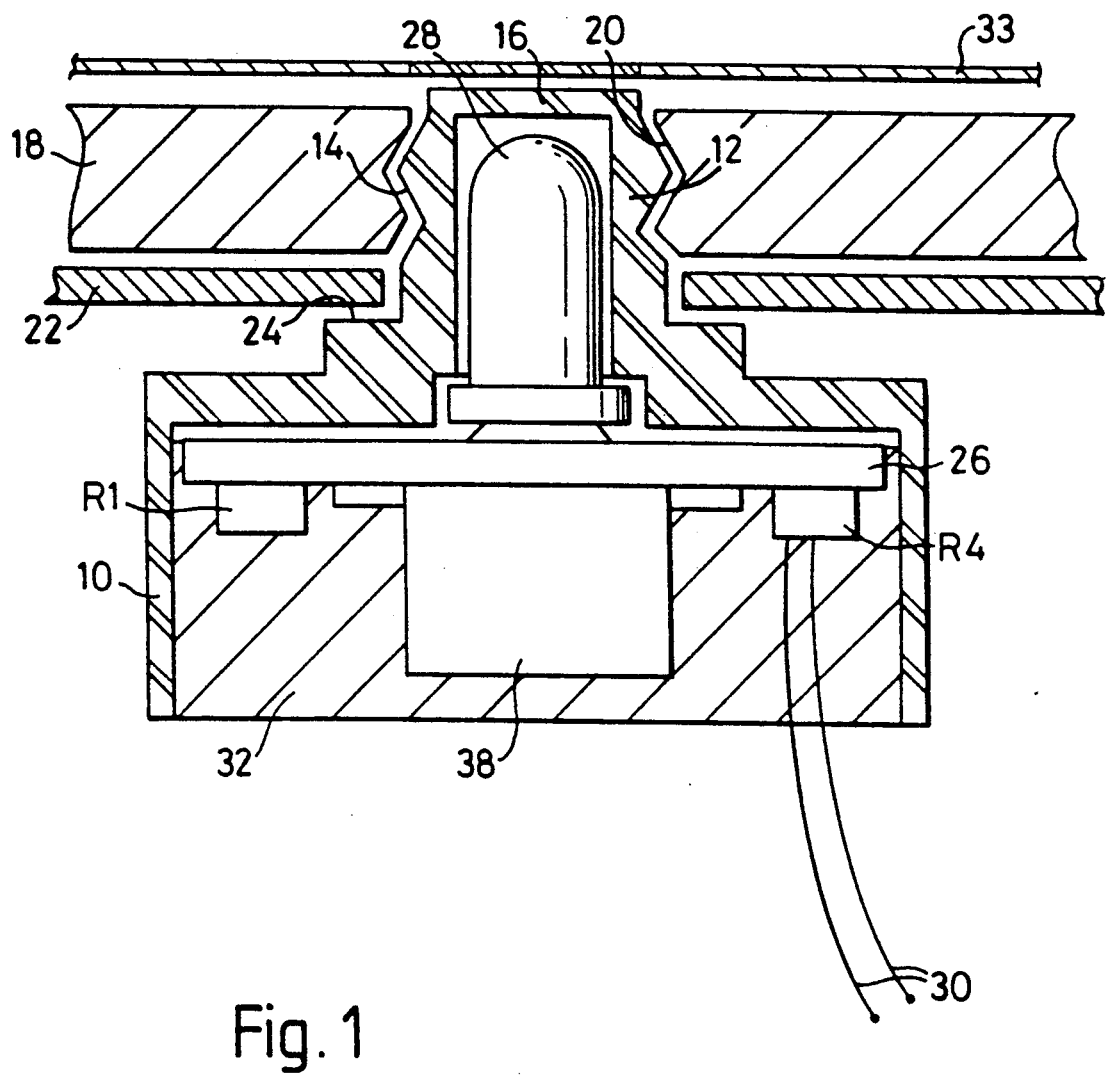
FIG. 1 is a cross-sectional side view showing one form of assembly in accordance with the invention in position on a supporting panel.

Referring to FIG. 1, a housing 10 comprising a generally cylindrical plastics moulding has a central projecting portion 12 formed with an exterior screw thread 14 and an end window 16. Conveniently, the entire housing 10 is moulded from a transparent or translucent material to form the window 16 integrally. The housing is mounted on a supporting panel 18 by screwing the projecting portion 12 into a correspondingly threaded hole 20 such that the surface of the window 16 lies flush with or just above the outer surface of the panel 18. The panel 18 may be, for example, part of the cover of a limit switch.

IF required by the particular application, sealing may be provided by a gasket 22 trapped between the panel 18 and a shoulder 24 formed on the housing 10.

A printed circuit board (pcb) 26 is positioned within the housing 10 and mounts a light-emitting diode (LED) 28 extending into the hollow interior volume of the projecting portion 12, which is of a shape and size corresponding substantially to that of the LED 28, so as to be visible through the window 16. Circuit components to be described are mounted on the opposite surface of the pcb 26, flying leads 30 being provided for connecting the assembly to the circuit to be monitored.

The volume indicated at 32 is filled with a potting compound, e.g. epoxy resin, to encapsulate the components and secure the pcb 26 in position.

An identification label 33 is attached to the outside of the panel 18. This is suitably a self-adhesive plastic label with a clear area through which the LED 28 may be viewed. The label 33 also provides additional sealing.

Figure 2:
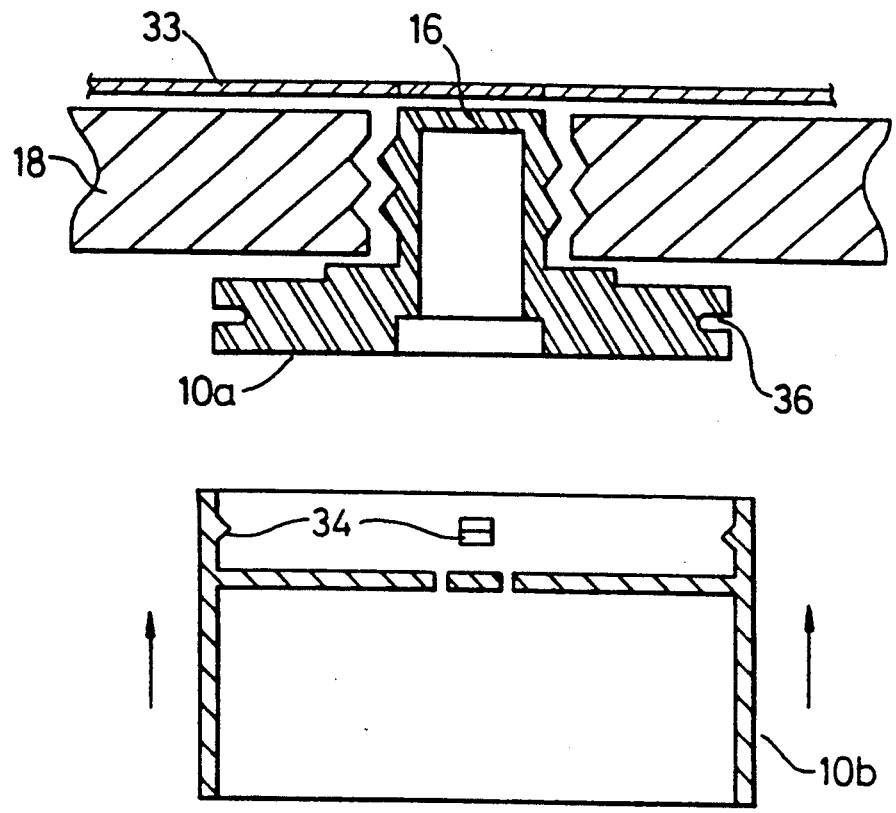
FIG. 2 is a cross-sectional side view of a housing of a modified embodiment in disassembled condition.
Figure 3:
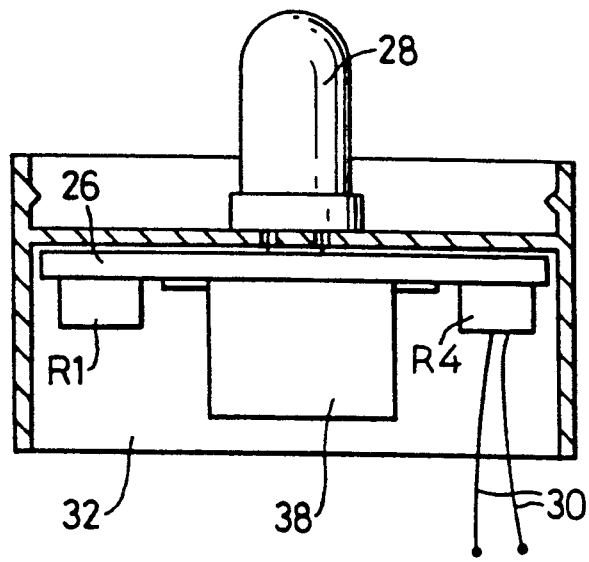
FIG. 3 shows part of the housing of FIG. 2 with components mounted thereon.

FIGS. 2 and 3 show a modified embodiment in which like parts are denoted by like reference numerals. The housing 10 is formed in two parts 10a,10b which can be snap-fitted together by teeth 34 engaging in notches 36, thus enabling mounting and wiring to be carried out separately.

Figure 4:
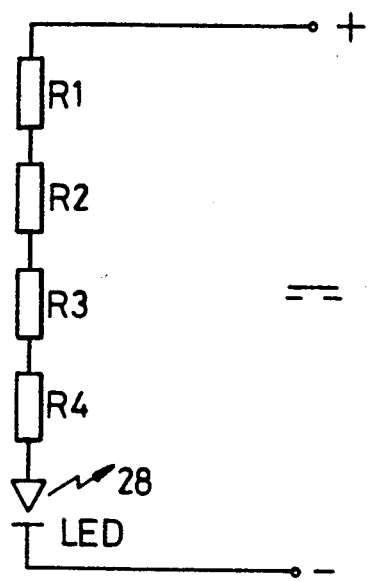
FIGS. 4 to 6 are circuit diagrams of alternative circuitry for the assembly.

FIG. 4 shows the circuit arrangement for use with d.c. power. Since the LED 28 requires a low operating voltage (typically 1.8V) and the circuit being monitored is a power circuit of 100–450V, a voltage drop is provided by resistors R1–R4. Use of a plurality of resistors allows the heat dissipation to be spaced within the housing 10. Suitably the epoxy 32 is a high heat transfer grade.

Figure 5:
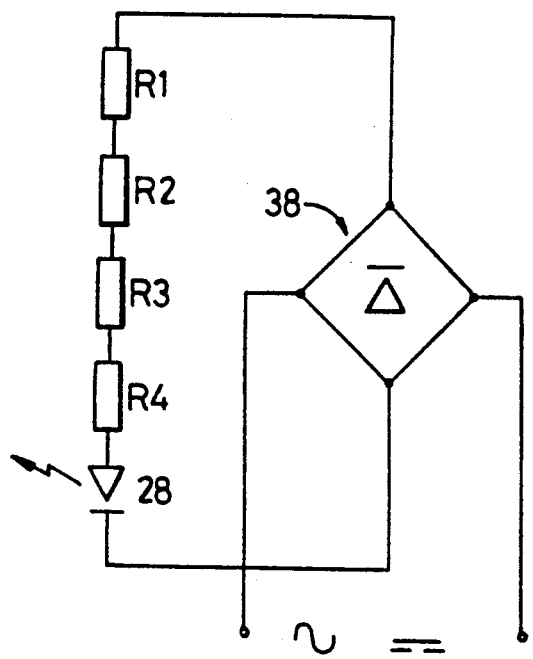

The circuit of FIG. 5 includes a diode bridge rectifier 38 thus allowing the assembly to monitor both d.c. and a.c. circuits.

Preferably, the bridge 38 is a surface mounting i.c. and the resistors R1–R4 are surface mounting chip resistors, all of which are readily available commercially, as indicated schematically in FIGS. 1 to 3.

Figure 6:
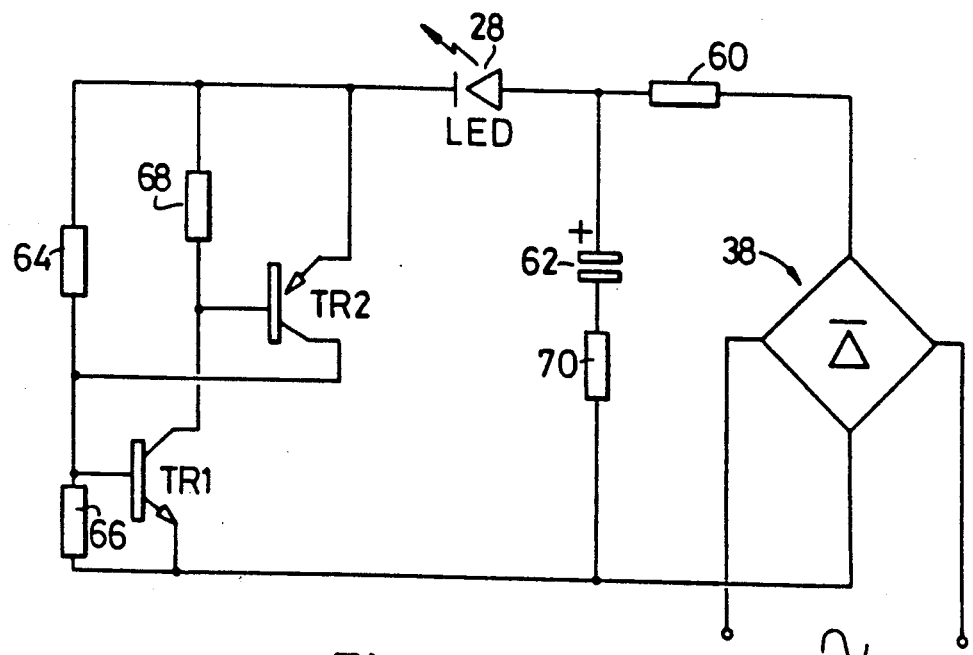

The circuit of FIG. 6 gives flashing illumination of the led 28 when power is applied. Rectifier bridge 38 causes capacitor 62 to charge positively via resistor 60. The voltage appearing across capacitor 62 results in a slightly lower voltage appearing across the discharge circuit comprising TR1, TR2 and resistors 64, 66, 68. When the voltage developed across resistor 66 becomes sufficient to cause TR1 base-emitter conduction then TR1 forces TR2 to conduct, and positive feedback results in TR1,TR2 latching into the on state. A high capacitor discharge current then flows from 62 through LED 28, TR2 emitter-collector and TR1 base-emitter. The level of current is limited by resistor 70. During this discharge period a relatively high energy pulse of light is emitted from the LED.

Upon the discharge current reaching a low value, TR1,TR2 revert to the off state when the LED 28 is extinguished. The cycle repeats for as long as a voltage is applied to the input terminals.

The invention described herein provides a pilot light assembly having simple and compact construction, utilizes a minimum of electrical components to allow a standard LED to be connected to high voltages, and allows convenient mounting and connection in practical use.

We claim:

1. A pilot light assembly for use in indicating presence of relatively high voltages, comprising:

A. a light emitting diode (LED);

B. means for converting the voltage monitored to a relatively low d.c. voltage and applying this to the LED;

C. a housing, made from a transparent or translucent material for containing the LED and the voltage converting means, the housing being adapted for mounting on a supporting panel; and where, the LED is mounted substantially centrally on one side of a printed circuit board (pcb), the other side of which mounts the voltage converting means; and D. the housing comprises a first, hollow projecting portion adapted for securement in an aperture in the panel and having an end face providing a window for viewing the LED, the window being generally flush with the outside surface of the panel when the pilot light assembly is installed, and a second hollow body portion disposed rearwardly of the projecting portion, such that the projecting portion extends substantially from the centre of the body portion;

E. the pcb being located in the body portion such that the LED extends into the hollow interior of the projecting portion, and the interior volume of the body portion being filled with a potting material to encapsulate the voltage converting means and secure the pcb in the housing.

2. The assembly of claim 1, in which the projection portion has an external surface formed as a screw thread, and wherein the interior volume of the projecting portion is of a shape and size corresponding substantially to that of the LED.

3. The assembly of claim 1, in which the voltage converting means includes a resistant dropping resistor chain comprising a plurality of separate resistors spaced apart around the interior of the housing.

4. The assembly claimed in claim 3, the resistors being surface mounting devices on the pcb.

5. The assembly of claim 4, in which the voltage converting means further includes a bridge rectifier circuit in the form of a surface mounting integrated circuit on the pcb.

6. The assembly of claim 5, in which the voltage converting means includes a capacitive charge-discharge circuit to produce flashing operation of the LED.

7. The assembly of claim 1 wherein the potting material is of a high heat transfer grade.

8. The assembly of claim 1 wherein the first housing comprises:

A. a generally cylindrical, hollow portion for enclosing the LED, the external surface of the cylindrical portion being threaded for screwing into a threaded hole in the support panel;

B. a gnerally rectangular portion which mates with the second housing and from which the cylindrical portion extends outwardly from the centre thereof; and, C. a window for viewing the LED which encloses the end of the cylindrical portion opposite the rectangular portion, the window being generally flush with the outside surface of the supporting panel when the pilot light assembly is mounted in the supporting panel.

9. The assembly of claim 2 wherein the means for connecting the first housing to the second housing includes slots in the edge of the rectangular portion of the first housing for engaging teeth in the mating portion of the second housing.

10. The assembly of claim 1 wherein the voltage converting means includes a resistance dropping resistor chain comprising a plurality of separate surface mounted resistors spaced apart on the pcb.

11. The assembly of claim 10 wherein the voltage converting means further includes a bridge rectifier circuit in the form of a surface mounting integrated circuit mounted on the pcb.

12. The assembly of claim 11 wherein a potting material having high heat transfer qualities is used to encapsulate the voltage converting means and secure the pcb in the second housing.

13. The assembly of claim 5, in which the voltage converting means includes a capacitive charge-discharge circuit to produce flashing operation of the LED.

14. A pilot light assembly for use in indicating the presence of relatively high voltages comprising:

A. a light emitting diode (LED);

B. means for converting the voltage monitored to a relatively low d.c. voltage and applying this low d.c. voltage to the LED;

C. a printed circuit board (pcb) on which the LED is mounted substantially in the center of one side and the voltage converting means is mounted on the other side;

D. a first housing, made from a transparent or translucent material being adapted for mounting on a supporting panel and for enclosing the LED;

E. a second housing generally rectangular in shape for containing the pcb and the voltage converting means; and, F. means for connecting the first housing to the second housing.

* * * * *